United States Patent
Kim et al.

(10) Patent No.: US 8,085,589 B2
(45) Date of Patent: *Dec. 27, 2011

(54) FLASH MEMORY DEVICE AND PROGRAM RECOVERY METHOD THEREOF

(75) Inventors: Moo-Sung Kim, Yongin-si (KR); Young-Ho Lim, Yongin-si (KR)

(73) Assignee: Samsung Electronics Co., Ltd., Maetan-dong, Yeongtong-gu, Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/881,321

(22) Filed: Sep. 14, 2010

(65) Prior Publication Data

US 2011/0002174 A1    Jan. 6, 2011

Related U.S. Application Data

(63) Continuation of application No. 12/216,593, filed on Jul. 8, 2008, now Pat. No. 7,804,712.

(30) Foreign Application Priority Data

Jul. 10, 2007    (KR) .................. 10-2007-0069261

(51) Int. Cl.
*G11C 16/04* (2006.01)
(52) U.S. Cl. .......... 365/185.03; 365/185.17; 365/185.19
(58) Field of Classification Search ............. 365/185.03, 365/185.17, 185.18, 185.19, 185.2, 185.25
See application file for complete search history.

(56) References Cited

U.S. PATENT DOCUMENTS

| | | | |
|---|---|---|---|
| 6,522,583 B2 | 2/2003 | Kanda et al. | |
| 6,829,167 B2 | 12/2004 | Tu et al. | |
| 7,180,787 B2 | 2/2007 | Hosono et al. | |
| 7,251,153 B2 | 7/2007 | Sakai | |
| 7,804,712 B2 * | 9/2010 | Kim et al. ............ | 365/185.03 |
| 2007/0058432 A1 | 3/2007 | Hosono | |
| 2007/0171719 A1 * | 7/2007 | Hemink et al. ......... | 365/185.14 |

FOREIGN PATENT DOCUMENTS

| | | | |
|---|---|---|---|
| JP | 07-320487 A | | 12/1995 |
| KR | 10-2006-0044855 A | | 5/2006 |
| KR | 10-2007-0029583 A | | 3/2007 |

* cited by examiner

*Primary Examiner* — Richard Elms
*Assistant Examiner* — Hien Nguyen
(74) *Attorney, Agent, or Firm* — Muir Patent Consulting, PLLC

(57) ABSTRACT

A method of programming a flash memory includes programming memory cells connected to a selected word line by applying a first voltage to the selected word line and a second voltage to non-selected word lines, the second voltage being lower than the first voltage, lowering the first voltage of the selected word line to a third voltage after programming the memory cells connected to the selected word line, the third voltage being lower than the first voltage, and recovering a fourth voltage of the selected word line and the non-selected word lines, the fourth voltage being lower than the second and third voltages.

31 Claims, 6 Drawing Sheets

FLASH MEMORY DEVICE AND PROGRAM RECOVERY METHOD THEREOF

CROSS REFERENCE TO RELATED APPLICATION

This is a continuation application based on application Ser. No. 12/216,593, filed Jul. 8, 2008, now U.S. Pat. No. 7,804,712 the entire contents of which is hereby incorporated by reference.

BACKGROUND OF THE INVENTION

1. Field of the Invention

Embodiments relate to a semiconductor memory device. More particularly, embodiments relate to a recovery method of a flash memory device.

2. Description of the Related Art

Semiconductor memory devices are kinds of storage units in which data can be stored therein or retrieved therefrom. Semiconductor memory devices may be classified into random access memories (RAMs) and read-only memories (ROMs). ROMs retain data even without power. There are various types of ROMs, e.g., programmable ROMs, erasable and programmable ROMs, electrically programmable and erasable ROMs, flash memories, and so on. Flash memories may be further differentiated in NOR and NAND types. NAND-type flash memory devices are now widely employed in memory cards capable of storing large-quantities of data, because they allow higher integration density than NOR-type flash memory devices.

SUMMARY OF THE INVENTION

Embodiments are therefore directed to a flash memory device and a method of programming the same.

According to an embodiment, methods of programming a flash memory may include programming memory cells connected to a selected word line by applying a first voltage to the selected word line and a second voltage to non-selected word lines, the second voltage being lower than the first voltage, and recovering a fourth voltage of the selected word line and the non-selected word lines. The recovering may include lowering the first voltage of the selected word line to a third voltage after programming the memory cells connected to the selected word line, the third voltage being lower than the first voltage, the fourth voltage being lower than the second and third voltages.

In some embodiments, the second voltage and the third voltage may have the same voltage level.

In other embodiments, the fourth voltage may be a ground voltage.

In still other embodiments, the flash memory may be a NAND type flash memory.

In yet other embodiments, recovering of the fourth voltage may be simultaneous for both the selected word line and the non-selected word lines.

According to an embodiment, methods of programming a NAND flash memory include applying a program voltage to a selected word line and a pass voltage to non-selected word lines, and recovering a ground voltage of the selected word line and the non-selected word lines after lowering the program voltage of the selected word line into the pass voltage.

In other embodiments, the recovering of the ground voltage may be simultaneous for both the selected word line and the non-selected word lines.

According to an embodiment, flash memory devices may include a memory cell array including a plurality of cell strings, each cell string having a plurality of memory cells, a decoder connected to the memory cells through a word line to apply a first voltage to a selected word line and a second voltage to non-selected word lines during a program operation, the second voltage being lower than the first voltage, and a high voltage generation and control circuit configured to provide the first and second voltages. The high voltage generation and control circuit may be configured to lower the first voltage of the selected word line to a third voltage and then to recover a fourth voltage of the second and third voltages of the selected word line and the non-selected word lines during a program recovery operation, the third voltage being lower than the first voltage, the fourth voltage being lower than the second and third voltages.

In some embodiments, the second voltage and the third voltage may be the same voltage level.

In other embodiments, the fourth voltage may be a ground voltage.

In still other embodiments, the flash memory devices may further include a page buffer connected to the cell string through a bit line, providing a power voltage or a ground voltage to the bit line according to program data during a program operation.

In even other embodiments, the page buffer may include a plurality of page buffer units and the two strings are connected to each of the page buffer units.

In yet other embodiments, the flash memory may be a NAND type flash memory.

In yet other embodiments, the recovering of the fourth voltage may be simultaneous for both the selected word line and the non-selected word lines.

In further embodiments, the plurality of memory cells may be connected in series.

In an embodiment, flash memory systems may include a flash memory device and a memory controller controlling the flash memory device. The flash memory device may include a memory cell array including a plurality of cell strings, each cell string having a plurality of memory cells, a decoder connected to the memory cells through a word line to apply a first voltage to a selected word line and a second voltage to non-selected word lines during a program operation, the second voltage being lower than the first voltage, and a high voltage generation and control circuit configured to provide the first and second voltages. The high voltage generation and control circuit may be configured to lower the first voltage of the selected word line to a third voltage and then to recover a fourth voltage of the second and third voltages of the selected word line and the non-selected word lines during a program recovery operation, the third voltage being lower than the first voltage, the fourth voltage being lower than the second and third voltages.

BRIEF DESCRIPTION OF THE DRAWINGS

The above and other features and advantages will become more apparent to those of ordinary skill in the art by describing in detail exemplary embodiments thereof with reference to the attached drawings, in which.

DETAILED DESCRIPTION

Korean Patent Application No. 10-2007-0069261, filed on Jul. 10, 2007, in the Korean Intellectual Property Office, and entitled: "NAND Flash Memory Device and Program Recovery Method Thereof," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

Figure 1:
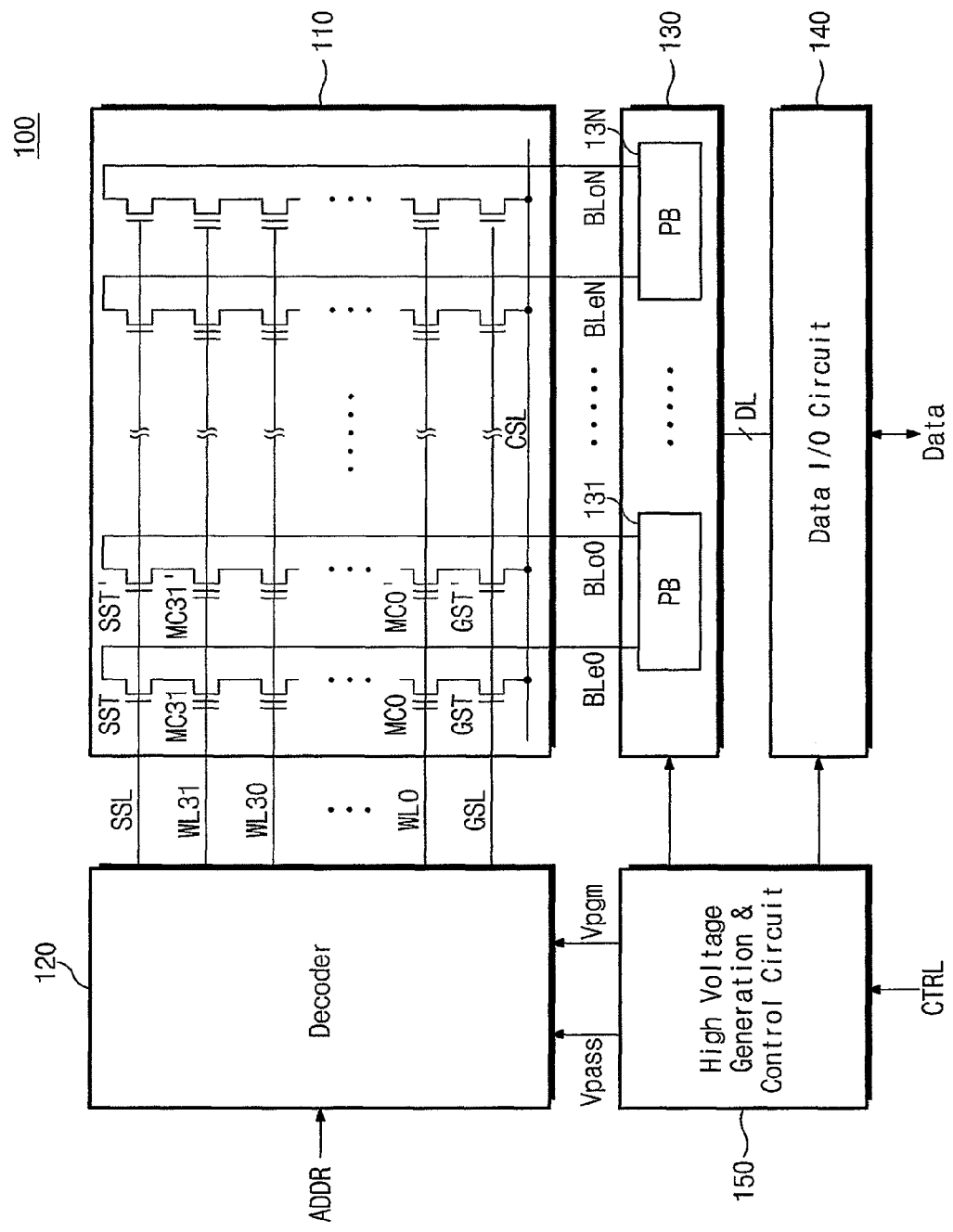
FIG. 1 illustrates a block diagram of a flash memory according to an embodiment.

FIG. 1 illustrates a block diagram of a flash memory according to embodiments. Referring to FIG. 1, the flash memory 100 may include a memory cell array 110, a decoder 120, a page buffer 130, a data input/output circuit 140, and high voltage generation and control circuit 150. FIG. 1 illustrates a NAND-type flash memory.

The memory cell array 110 may include a plurality of memory blocks. Only one memory block is shown in FIG. 1. Each memory block may include a plurality of pages. Each page may include a plurality of memory cells, e.g., MC0 to MC31. The memory block may be an erasable unit and the page may be a readable or programmable unit.

The memory cells may be connected to a corresponding word line WL0 to WL31, and may include at least one page. Referring to FIG. 1, the memory cells connected to the one word line may include two pages, i.e., even and odd pages. The memory cells MC0 to MC31 of even pages may be connected to the even bit lines BLe0, BLe1, . . . , BLeN. Memory cells MC0' to MC31' of odd pages may be connected to the odd bit lines BLo0, BLo1, . . . , BLoN.

In a case of a multi level cell (MLC), memory cells connected to the one word line may constitute four pages. In this case, the even page and the odd page may include a least significant bit (LSB) page and a most significant bit (MSB) page, respectively.

Additionally, each memory block may include a plurality of cell strings. Each cell string may be connected in series to the ground selection transistor GST, the series-connected memory cells MC0 to MC31, and the string selection transistor SST. The ground selection transistor GST may be connected to a common source line CSL. The string selection transistor SST may be connected to a bit line BL.

The word lines WL0 to WL31 may be respectively connected to the gates of the memory cells MC0 to MC31 to apply a word line voltage. Here, the word line voltage may include a program voltage Vpgm and a pass voltage Vpass, which are applied during a program operation. The ground selection line GSL maybe connected to a gate of the ground selection transistor GST. The string selection line SSL may be connected to a gate of the string selection transistor SST.

The decoder 120 may be connected to the memory cell array 110 through the ground selection line GSL, the word lines WL0 to WL31, and the string selection line SSL. The decoder 120 may receive an address ADDR and may select one word line (e.g., WL0) during a program operation. The decoder 120 may apply a program voltage Vpgm to the selected word line WL0 and a pass voltage Vpass to the non-selected word lines WL1 to WL31 during a program operation. The program voltage Vpgm and the pass voltage Vpass may be provided from the high voltage generation and control circuit 150.

The page buffer 130 may be connected to the memory cell array 110 through the bit line BL. The page buffer 130 may be controlled by the high voltage generation and control circuit 150, and may include a plurality of page buffer units 131 to 13N. Each page buffer unit (e.g., 131) may be connected to two cell strings through the two bit lines BLe0 and BLo0. The page buffer 130 may program an even page or an odd page during a program operation using one of the even bit lines BLe0 to BLeN and the odd bit lines BLo0 and BLoN. Hereinafter, it is assumed that the even page is already programmed and a program operation on the odd page is in progress.

Each page buffer unit (e.g., 131) may apply a ground voltage 0V or a power voltage Vcc to the odd bit lines BLo0 to BLoN according to input data. If the input data is 0, the ground voltage 0 V may be applied. If the input data is 1, the power voltage Vcc may be applied. On the other hand, a program inhibit voltage, e.g., a power voltage Vcc, may be applied to the even bit lines BLe0 to BLeN.

During a program operation, the ground voltage 0 V may be applied to the bit line BLo0 to which the program cell (e.g., MC0') is connected, and the power voltage Vcc may be applied to the bit line BLe0 to which the program inhibit memory cell (e.g., MC0) is connected. During the program operation, the program voltage Vpgm may be applied to the selected word line WL0, and the pass voltage Vpass may be applied to the non-selected word lines WL1 to WL31.

The data input/output circuit 140 may be controlled by the high voltage generation and control circuit 150. The data input/output circuit 140 may generally receive or output data by byte or word units. The data input/output circuit 140 may be connected to the page buffer 130 through a data line DL.

The high voltage generation and control circuit 150 may generate the program voltage Vpgm or the pass voltage Vpass during a program operation, and may control the page buffer 130 and the data input/output circuit 140. The high voltage generation and control circuit 150 may operate in response to an external control signal CTRL. Here, the external control signal CTRL may include a chip enable signal nCE, a command latch enable signal nCLE, an address latch enable signal nALE, a write enable signal new, and a read enable signal nRE, etc.

The high voltage generation and control circuit 150 may lower the program voltage Vpgm to the pass voltage Vpass in the selected word line WL0 during a program recovery operation. Then, the high voltage generation and control circuit 150 may discharge the voltage of the selected word line WL0 and the non-selected word lines WL1 to WL31 to the ground voltage 0V.

In contrast, according to a typical program recovery operation, the selected word line WL0 is discharged from the program voltage Vpgm to the ground voltage 0V prior to the non-selected word lines WL1 to WL31 being discharged from the pass voltage Vpass to the ground voltage 0V. At this point, the gate of the program inhibit cell MC0 has the ground voltage 0V, and the channel has a boost voltage Vboost. Under this condition, electrons trapped in gate oxide of the program inhibit cell may escape through the channel, resulting in an electron leakage phenomenon.

Figure 2:
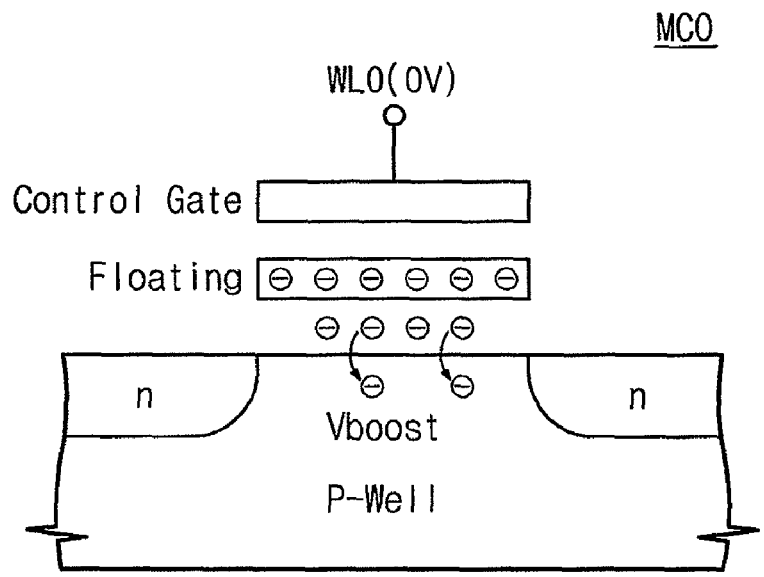
FIG. 2 illustrates a conceptual diagram of an electron leakage phenomenon of a program inhibit memory cell.
Figure 3:
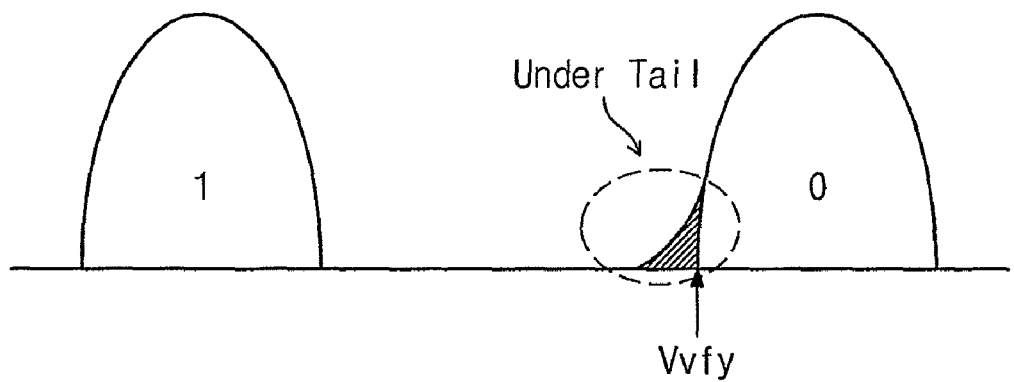
FIG. 3 illustrates a view of when a threshold voltage of the program inhibit memory cell is lowered due to the electron leakage phenomenon.

FIG. 2 illustrates a conceptual diagram of the electron leakage phenomenon of the program inhibit memory cell MC0 associated with the selected word line WL0. FIG. 3 illustrates when a threshold voltage of the program inhibit memory cell MC0 is lowered due to the electron leakage phenomenon, referred to as an under tail phenomenon. The under tail phenomenon may deteriorate program distribution characteristics of a memory cell.

In contrast, according to an embodiment, the flash memory device 100 of FIG. 1 may be operated to prevent or reduce deterioration of the threshold voltage distribution characteristics in a memory cell due to the under tail phenomenon. This will be described in more detail below.

Figure 4:
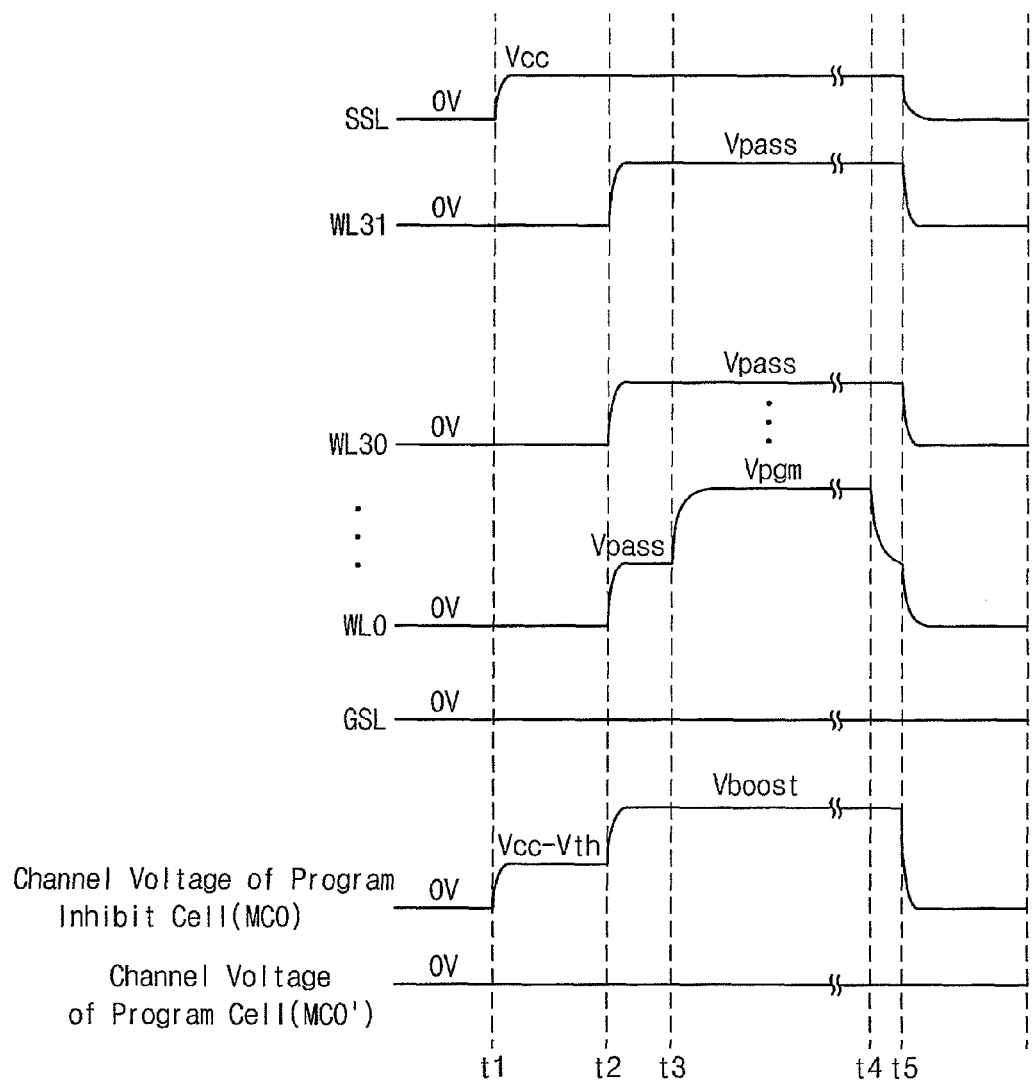
FIG. 4 illustrates a timing diagram of a method of programming the flash memory of FIG. 3.

FIG. 4 illustrates a timing diagram of a method of programming the flash memory device 100 of FIG. 1.

At t1, the power voltage Vcc is applied to the string selection line SSL. At this point, a channel voltage of the program inhibit memory cell MC0 becomes Vcc-Vth, where Vth is a threshold voltage of the string selection transistor SST. The string selection transistor SST enters a cut-off state.

At t2, the pass voltage Vpass (e.g., about 8 V) is applied to the selected word line WL0 and the non-selected word lines WL1 to WL31. At this point, capacitance coupling occurs between the gate of the program inhibit memory cell MC0 and the channel. Due to capacitance coupling, a channel voltage of the program inhibit memory cell MC0 increases to the boost voltage Vboost. The boost voltage Vboost prevents F-N tunneling in the program inhibit memory cell MC0.

At t3, the program voltage Vpgm is applied to the selected word line WL0. In the program cell MC0', electrons in the channel are implanted on a floating gate due to F-N tunneling. In the program inhibit memory cell MC0, electrons in the channel are not implanted on a floating gate, since F-N tunneling does not occur.

At t4, a program recovery operation is performed. The program voltage Vpgm is lowered to the pass voltage Vpass in the selected word line WL0. Then, at t5, the pass voltage Vpass of the selected word line WL0 and the non-selected word lines WL1 to WL31 is discharged to the ground voltage 0 V.

According to the program recovery method of an embodiment, the under tail phenomenon that lowers a threshold voltage of the program inhibit memory cell MC0 does not occur. This will be described in more detail with reference to FIGS. 5 and 6.

Figure 5:
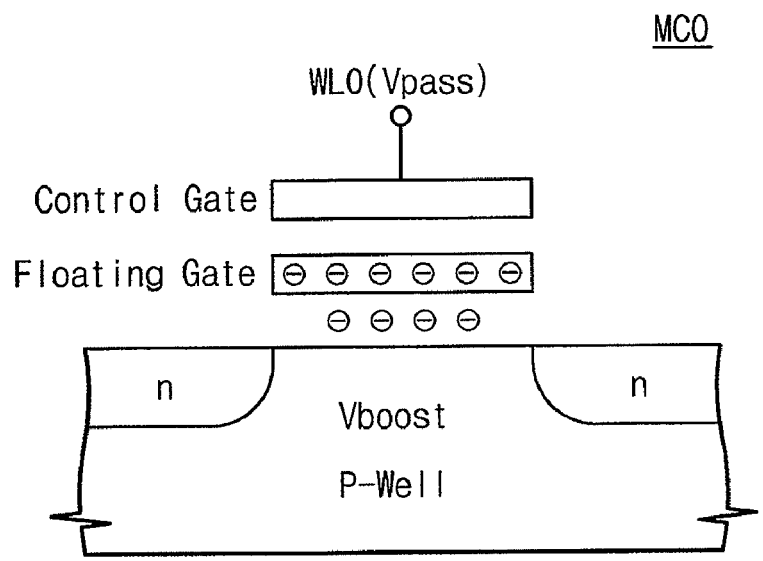
FIG. 5 illustrates a conceptual diagram of a bias condition of the program inhibit memory cell during a program recovery operation.
Figure 6:
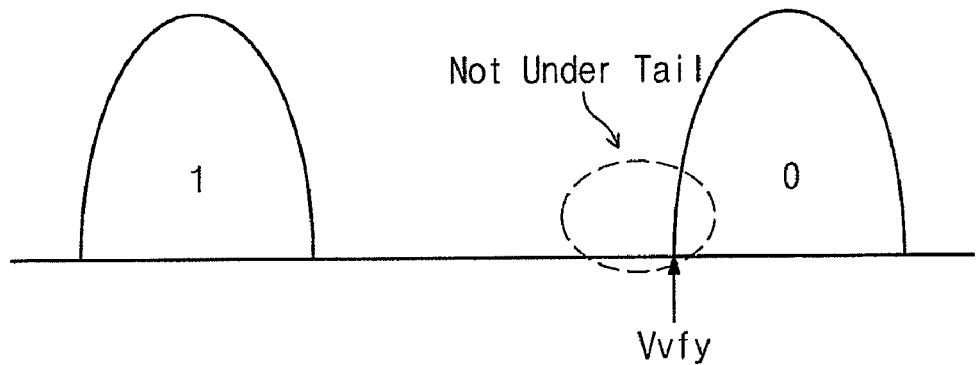
FIG. 6 illustrates a diagram of when the under tail phenomenon does not occur during the program inhibit memory cell.

FIG. 5 illustrates a conceptual diagram of a bias condition of a memory cell MC0 during a program recovery operation. Referring to FIG. 5, during a program recovery operation t4 to t5 of FIG. 4, the gate of the program inhibit memory cell MC0 has the pass voltage Vpass, and the channel has the boost voltage Vboost. Accordingly, electrons trapped in gate oxide of the program inhibit memory cell MC0 are not transferred into the channel. FIG. 6 illustrates that the under tail phenomenon does not occur during a program inhibit memory cell MC0.

The flash memory device according to an embodiment lowers a voltage of the selected word line, and then discharges the voltage of the selected word line and non-selected word lines to the ground voltage 0 V during a program recovery operation. Since a weak electrical field is formed between the gate of the program inhibit memory cell and the channel during a program recovery operation, electrons trapped in gate oxide are not transferred into the channel. Accordingly, an embodiment may prevent the under tail phenomenon of a typical program recovery method.

According to the above embodiments, after lowering the program voltage Vpgm to the pass voltage Vpass, the pass voltage Vpass may be discharged into the ground voltage about 0 V, but the embodiments are not limited thereto. That is, as apparent to those skilled in the art, a program voltage may be lowered to a second voltage, e.g., near the pass voltage Vpass, and then discharge the second voltage to a third voltage, e.g., near the ground voltage 0 V.

Figure 7:
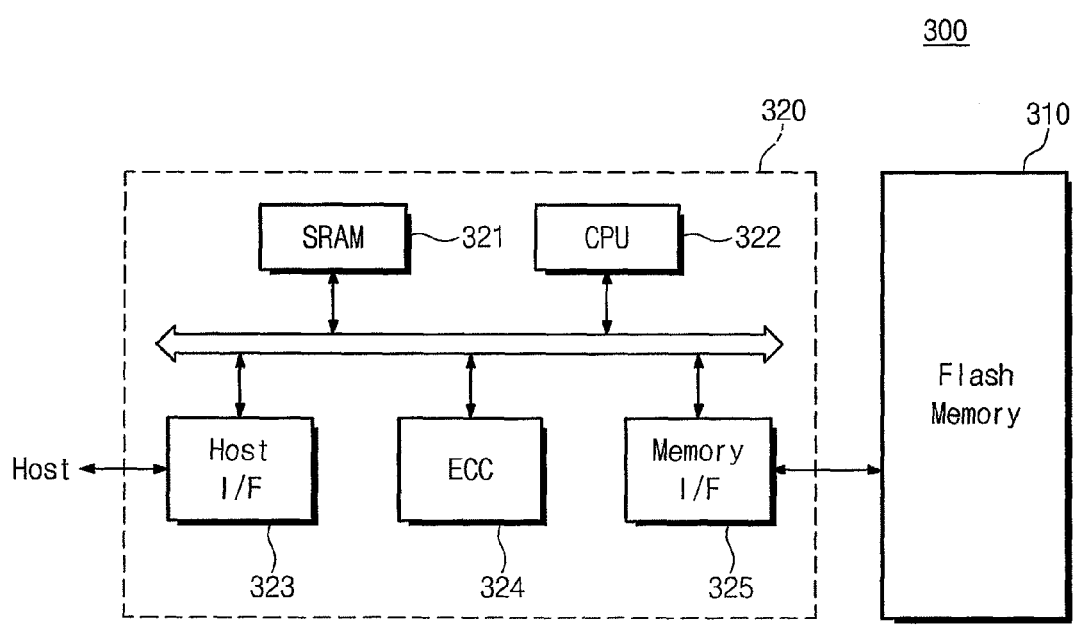
FIG. 7 illustrates a block diagram of a memory card with a flash memory device of an embodiment.

FIG. 7 illustrates a block diagram of a memory card 300 with a flash memory device of an embodiment. Referring to FIG. 7, the memory card 300 supporting high capacity data storage may include a flash memory device 310 of an embodiment. The memory card 300 may also include a memory controller 320 that controls general data exchanges between a host and the flash memory device 310. The memory controller may include a static random access memory (SRAM) 321, a central processing unit (CPU) 322, a host interface (I/F) 323, an error correction block (ECC) 324, and a memory I/F 325.

The SRAM 321 may be used for an operational memory of the CPU 322. The host I/F 323 may include a data exchange protocol of a host connected to the memory card 300. The ECC 324 may detect and correct errors in data read from the multi bit flash memory device 310. The memory I/F 325 may interface with the flash memory device 310.

The CPU 322 may perform general control operations for data exchange with the memory controller 320. Although not illustrated in the drawings, it is apparent to those skilled in the art that the memory card 300 may further include a read only memory (ROM) (not shown) storing code data for interfacing with the host.

Figure 8:
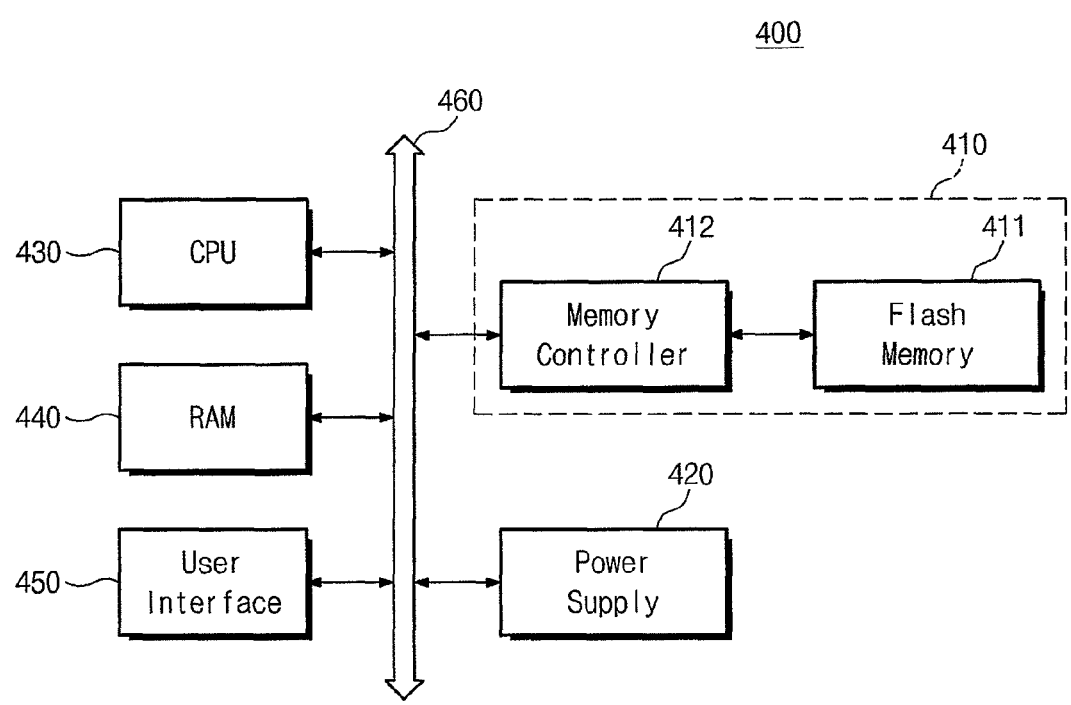
FIG. 8 illustrates a block diagram of a memory system with a flash memory device of an embodiment.

FIG. 8 illustrates a block diagram of a memory system 400 with a flash memory device according to an embodiment. Referring to FIG. 8, the memory system 400 may include a flash memory system 410, a power source 420, a CPU 430, a RAM, a user interface 450, and a system bus 460.

The flash memory system 410 may include a memory controller 412 and a flash memory device 411. The flash memory system 410 may be electrically connected to the power source 420, the CPU 430, the RAM 440, and the user interface 450 through the system bus 460. The flash memory device 411 may store data according to a control of the memory controller 412, which are provided through the user interface 450, or processed by the CPU 430.

If the flash memory system 410 is mounted as a semiconductor disk device (SSD) instead of a hard disk, the system 400 may experience a drastically improved booting speed. Although not illustrated in the drawings, it is apparent to those skilled in the art that the system may further include an application chipset, a camera image processor, etc.

The flash memory device and/or the memory controller according to embodiments may be mounted through various forms of packages. For example, the various forms of packages may include package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP), wafer-level processed stack package (WSP), etc.

The flash memory device according to embodiments may lower a voltage of a selected word line, e.g., to a pass voltage during a program recovery operation, and then, may discharge the voltage of the selected word line and non-selected word lines to a ground voltage, e.g., 0 V. According to embodiments, the under tail phenomenon during a program recovery system may be reduced or prevented.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of programming, comprising:
    applying a program voltage to a selected word line of a flash memory device and pass voltages to plural unselected word lines of the flash memory device;
    then, while maintaining application of pass voltages to the plural unselected word lines, reducing the voltage applied to the selected word line to an intermediate voltage;
    then, before the selected word line is fully discharged, initiating a discharge of the plural unselected word lines.

2. The method of claim 1, further comprising:
    wherein reducing the voltage applied to the selected word line comprises connecting the selected word line to a node on which a first voltage is applied by a voltage generator.

3. The method of claim 2, wherein the first voltage is a pass voltage.

4. The method of claim 1, wherein further comprising:
    reducing the voltage applied to the selected word line from the intermediate voltage simultaneously with reducing the voltages applied to the unselected word lines from pass voltages.

5. The method of claim 1, further comprising:
    reducing the voltage applied to the selected word line from the intermediate voltage and the voltages applied to the unselected word lines from pass voltages to a same reduced voltage.

6. The method of claim 5, wherein the same reduced voltage is a reference voltage.

7. The method of claim 6, wherein the same reduced voltage is ground.

8. The method of claim 1, wherein the pass voltages have the same magnitude.

9. The method of claim 8, wherein the intermediate voltage has the same magnitude as the pass voltages.

10. The method of claim 1, wherein the intermediate voltage is a pass voltage.

11. The method of claim 1, wherein the unselected word lines and the selected word line include all word lines of a memory block of a NAND-type flash memory.

12. A method of programming, comprising:
    applying a program voltage to a selected word line of a flash memory device and pass voltages to plural unselected word lines of the flash memory device;
    then, partially discharging the voltage of the selected word line to an applied intermediate voltage;
    then, completing the discharge of the selected word line and the unselected wordlines.

13. The method of claim 12, wherein the partially discharging the voltage of the selected word line is initiated before initiating any discharge of the unselected word lines.

14. The method of claim 13, wherein the applied intermediate voltage is a pass voltage.

15. The method of claim 13, wherein the applied intermediate voltage is the same as a pass voltage applied to a plural unselected word line.

16. The method of claim 15, wherein the pass voltages applied to the plural unselected word lines have the same magnitude.

17. The method of claim 16, wherein the unselected word lines and the selected word line include all word lines of a memory block of a NAND-type flash memory.

18. The method of claim 12, wherein completing the discharge of the selected word line comprises discharging the selected word line to 0V.

19. The method of claim 12, wherein completing the discharge of the selected word line and the unselected wordlines comprises discharging the selected word line and the unselected wordlines to the same voltage.

20. The method of claim 12, further comprising:
    initiating a discharge of the unselected word lines only after the selected word line has the intermediate voltage applied.

21. The method of claim 20, further comprising:
    initiating the discharge of the unselected word lines from the pass voltages simultaneously with initiating the discharge of the selected word line from the intermediate voltage.

22. The method of claim 21, wherein the selected world line and unselected word lines are discharged to a reference voltage.

23. The method of claim 22, wherein a pass voltage of a first magnitude is applied to at least the selected word line and unselected word lines immediately adjacent the selected word line after partially discharging the voltage of the selected word line to an applied intermediate voltage from the program voltage.

24. The method of claim 23, further comprising:
    applying the pass voltage of the first magnitude to at least the selected word line and the unselected word lines immediately adjacent the selected word line immediately prior to applying the program voltage to the selected word line.

25. The method of claim 23, wherein the unselected word lines and the selected word line include all word lines of a memory block of a NAND-type flash memory, and
    wherein a majority of said all word lines have the pass voltage of the first magnitude applied during the application of the program voltage to the selected word line.

26. The method of claim 25, further comprising:
    before applying a program voltage to the selected word line, applying the pass voltages to the selected and unselected word lines thereby boosting a voltage level of a channel of an inhibited memory cell due to a capacitive coupling.

27. A method of programming a NAND flash memory, comprising:
    applying pass voltages to unselected word lines and boosting a voltage level of a channel of a first memory cell to a boosted voltage in response to a capacitive coupling of the channel, the first memory cell being connected to a selected word line, the magnitude of the boosted voltage being sufficient to substantially inhibit programming of the first memory cell during a subsequent application of a program voltage to the selected word line;
    then, by increasing the voltage of the selected word line to the program voltage, injecting electrons into a floating gate of a second memory cell to be programmed, the second memory cell connected to the selected word line;

then, reducing the voltage applied to the selected word line from the program voltage to a reference voltage, wherein, prior to the voltage of the selected word line reaching the reference voltage, the voltage of the channel of the first memory cell is reduced from the boosted voltage at least by an amount to avoid a substantial reduction of the threshold voltage of the first memory cell.

28. A method of programming a flash memory, comprising:
    programming memory cells connected to a selected word line by applying a first voltage to the selected word line and a second voltage to non-selected word lines, the second voltage being lower than the first voltage;
    lowering the voltage of the selected word line from the first voltage to a third voltage, the third voltage being lower than the first voltage and being higher than a fourth voltage, the fourth voltage being lower than the second voltage; and
    discharging the selected word line and the non-selected word lines to the fourth voltage after lowering the voltage of the selected word line from the first voltage to the third voltage.

29. A method of programming a flash memory, comprising:
    programming memory cells connected to a selected word line by applying a first voltage to the selected word line and a second voltage to non-selected word lines, the second voltage being lower than the first voltage;
    lowering the voltage of the selected word line from the first voltage to a third voltage, the third voltage being lower than the first voltage and being higher than a fourth voltage, the fourth voltage being lower than the second voltage; and
    discharging the selected word line and the non-selected word lines to the fourth voltage at the same time after lowering the voltage of the selected word line from the first voltage to the third voltage.

30. A method of programming a flash memory, comprising:
    programming memory cells connected to a selected word line by applying a first voltage to the selected word line and a second voltage to non-selected word lines, the second voltage being lower than the first voltage; and
    lowering the voltage of the selected word line from the first voltage to a third voltage by applying the third voltage to the selected word line, the third voltage being lower than the first voltage; and then
    discharging the selected word line and the non-selected word lines to a fourth voltage, the fourth voltage being lower than the second and third voltages.

31. A method of programming a flash memory, comprising:
    programming memory cells connected to a selected word line by applying a first voltage to the selected word line and a second voltage to non-selected word lines, the second voltage being lower than the first voltage; and
    lowering the voltage of the selected word line from the first voltage to a third voltage by applying the third voltage to the selected word line, the third voltage being lower than the first voltage; and then
    discharging the selected word line and the non-selected word lines to a fourth voltage to prevent an electron leakage phenomenon of a program inhibited memory cell connected to the selected word line, the fourth voltage being lower than the second and third voltages.

* * * * *